US008630438B2

(12) United States Patent
Castro et al.

(10) Patent No.: US 8,630,438 B2
(45) Date of Patent: Jan. 14, 2014

(54) SPEAKER ISOLATION SYSTEM

(75) Inventors: Brian D. Castro, Hermosa Beach, CA (US); TienWhei Din, Carson, CA (US); Christopher Neumann, Granada Hills, CA (US)

(73) Assignee: Harman International Industries, Incorporated, Stamford, CT (US)

( * ) Notice: Subject to any disclaimer, the term of this patent is extended or adjusted under 35 U.S.C. 154(b) by 869 days.

(21) Appl. No.: 12/769,762

(22) Filed: Apr. 29, 2010

(65) Prior Publication Data

US 2010/0215204 A1 Aug. 26, 2010

Related U.S. Application Data

(63) Continuation of application No. 11/217,115, filed on Aug. 31, 2005, now Pat. No. 7,720,247.

(60) Provisional application No. 60/608,610, filed on Sep. 9, 2004.

(51) Int. Cl.
*H04R 1/02* (2006.01)
*H05K 5/00* (2006.01)

(52) U.S. Cl.
USPC .......................................... 381/386; 181/150

(58) Field of Classification Search
USPC ............ 381/87, 386, 395; 181/150, 198, 199
See application file for complete search history.

(56) References Cited

U.S. PATENT DOCUMENTS

| | | | | |
|---|---|---|---|---|
| 6,360,842 | B1 * | 3/2002 | Combest | 181/150 |
| 7,720,247 | B2 | 5/2010 | Castro et al. | |
| 2003/0123679 | A1 * | 7/2003 | Dudleston et al. | 381/386 |

* cited by examiner

*Primary Examiner* — Brian Ensey
(74) *Attorney, Agent, or Firm* — Brooks Kushman P.C.

(57) ABSTRACT

A loudspeaker mounting assembly for mounting a loudspeaker in an isolated relation to a structure includes an enclosure and a plurality of interface elements composed of a vibration-damping material. The enclosure has an interior for receiving the loudspeaker and includes at least two spaced-apart support members. Each of the at least two support members includes a support member outer surface and an inner surface extending from the support member outer surface into the support member. The inner surface defines a support member bore. Each interface element includes an interface element outer surface. Each interface element is disposed in a corresponding one of the support member bores and at least partially extends out from the respective support member outer surface, where each interface element outer surface contacts the respective inner surface of the support member.

33 Claims, 10 Drawing Sheets

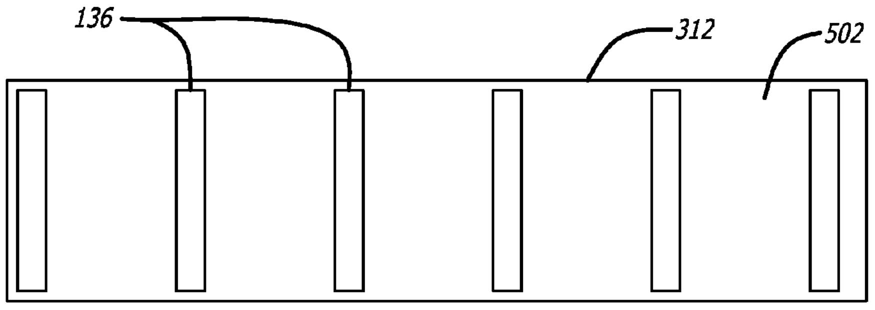
FIG. 5
FIG. 6
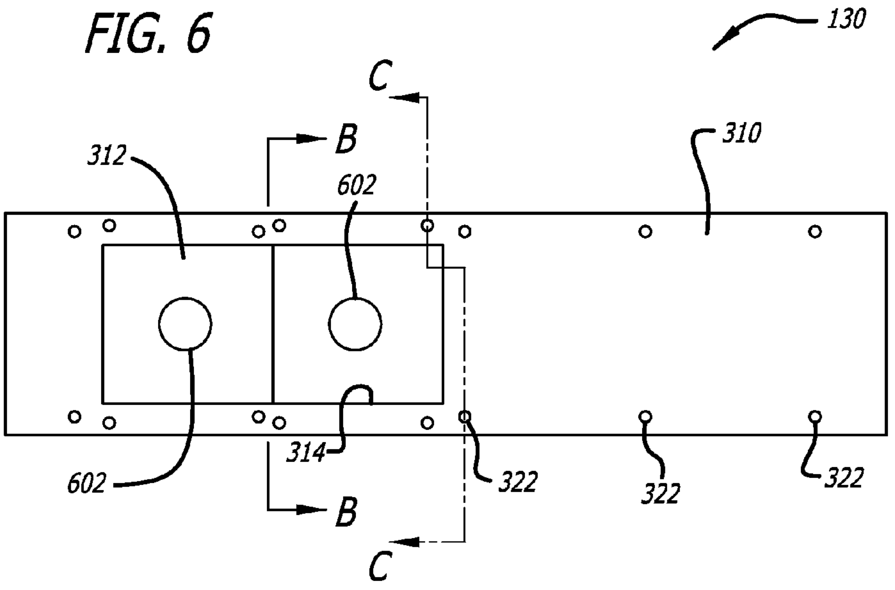

SPEAKER ISOLATION SYSTEM

This application is a continuation of U.S. application Ser. No. 11/217,115, filed on Aug. 31, 2005, now U.S. Pat. No. 7,720,247 titled SPEAKER ISOLATION SYSTEM; which claims priority under 35 U.S.C. §119(e) of U.S. Provisional Patent Application No. 60/608,610, filed Sep. 9, 2004, titled SPEAKER ISOLATION SYSTEM, which applications are incorporated by reference in this application in their entirety.

BACKGROUND OF THE INVENTION

1. Field of the Invention

This invention relates generally to the field of loudspeakers. More particularly, the invention relates to the mounting of one or more loudspeakers to a structure such as a wall or ceiling in a manner that isolates the loudspeakers from such a structure.

2. Related Art

Audio loudspeaker units, assemblies, and systems are mounted or positioned in various ways in listening areas. For instance, loudspeakers may be mounted in a modular manner, such as by providing a cabinet or housing intended for placement on a floor, shelf, or other surface. In such cases, the loudspeakers are readily movable or repositionable. In other cases, loudspeakers may be mounted in a more fixed manner, such as by suspending the loudspeakers from a ceiling or a wall. In these cases, support structures protruding from the wall or ceiling are required. In many of the mounting approaches noted thus far, an advantage exists in that the loudspeakers are often physically separate from a structure such as a wall or ceiling or otherwise can be acoustically and/or mechanically isolated from the structure with relative ease. One disadvantage of these mounting approaches is that the loudspeakers and their associated support structures take up space in the intended listening area (e.g., an indoor room, an outdoor patio, etc.). Accordingly, a relatively recent mounting technique entails incorporating loudspeakers into a structure so as to minimize the physical obstruction presented by the loudspeakers. For instance, in-wall and in-ceiling loudspeaker installation techniques have become popular in residences, recreational facilities, and the like. In these installations, the bulk of the loudspeakers is concealed by the structure so that, apart from a bezel or loudspeaker cover, the periphery of the loudspeakers facing the listening area is largely flush with the existing outer surface of the structure into which the loudspeakers are mounted.

Unfortunately, loudspeakers mounted in a structure are prone to transferring sound energy to the structure. During the operation of such loudspeakers, an in-structure mounting configuration may result in unwanted vibrations in the structure as well as unwanted acoustical effects that degrade sound quality and listening experience. Thus far, in-structure installation techniques for loudspeakers have not sufficiently addressed this problem. Accordingly, there remains a need for providing a speaker isolation system that accommodates in-structure installation while maintaining acceptable isolation as between the loudspeakers and the structure.

SUMMARY

According to one example of an implementation, a loudspeaker mounting assembly is provided for mounting a loudspeaker in an isolated relation to a structure. The loudspeaker mounting assembly comprises an enclosure and a plurality of interface elements composed of a vibration-damping material. The enclosure has an interior for receiving the loudspeaker and includes at least two spaced-apart support members. Each of the at least two support members includes a support member outer surface and an inner surface extending from the support member outer surface into the support member. The inner surface defines a support member bore. Each interface element includes an interface element outer surface. Each interface element is disposed in a corresponding one of the support member bores and at least partially extends out from the respective support member outer surface, where each interface element outer surface contacts the respective inner surface of the support member.

According to an example of another implementation, a loudspeaker assembly is provided that is mountable in an isolated relation to a structure. The loudspeaker assembly comprises an enclosure, a loudspeaker, and a plurality of interface elements composed of a vibration-damping material. The enclosure has an interior and an opening communicating with the interior, and includes at least two spaced-apart support members. Each of the at least two support members includes a support member outer surface and an inner surface extending from the support member outer surface into the support member. The inner surface defines a support member bore. The loudspeaker is mounted to the enclosure and extends into the interior through the opening. Each interface element includes an interface element outer surface. Each interface element is disposed in a corresponding one of the support member bores and at least partially extends out from the respective support member outer surface, where each interface element outer surface contacts the respective inner surface of the support member.

A method for installing a loudspeaker mounting assembly to a structure in an isolated manner is also provided according to an example of another implementation. According to the method, a loudspeaker mounting assembly is provided. The loudspeaker mounting assembly has an interior for receiving a loudspeaker and includes at least two opposing outer surfaces generally facing away from the interior, each outer surface having an outer surface bore. A plurality of interface elements composed of a vibration-damping material are placed into respective outer surface bores such that the interface elements protrude beyond the respective outer surfaces. The loudspeaker mounting assembly is mounted at an installation site of the structure, the installation site bounded by two or more structural members of the structure, where the interface elements contact respective structural members such that the loudspeaker mounting assembly is isolated from the structure and the transfer of vibrations from the loudspeaker mounting assembly to the structure is impeded.

Other apparatus, systems, methods, features, components and/or advantages of the invention or will become apparent to one with skill in the art upon examination of the following figures and detailed description. It is intended that all such additional apparatus, systems, methods, features, components and/or advantages be included within this description, be within the scope of the invention, and be protected by the accompanying claims.

BRIEF DESCRIPTION OF THE FIGURES

The invention can be better understood by referring to the following figures. The components in the figures are not necessarily to scale, emphasis instead being placed upon illustrating the principles of the invention. In the figures, like reference numerals designate corresponding parts throughout the different views.

FIG. 5 is a rear elevation view of the enclosure assembly illustrated in FIG. 3.

FIG. 6 is a front elevation view of the enclosure assembly illustrated in FIG. 3.

DETAILED DESCRIPTION

Examples of implementations of the present subject matter will now be described with reference to FIGS. 1-13.

Figure 1:
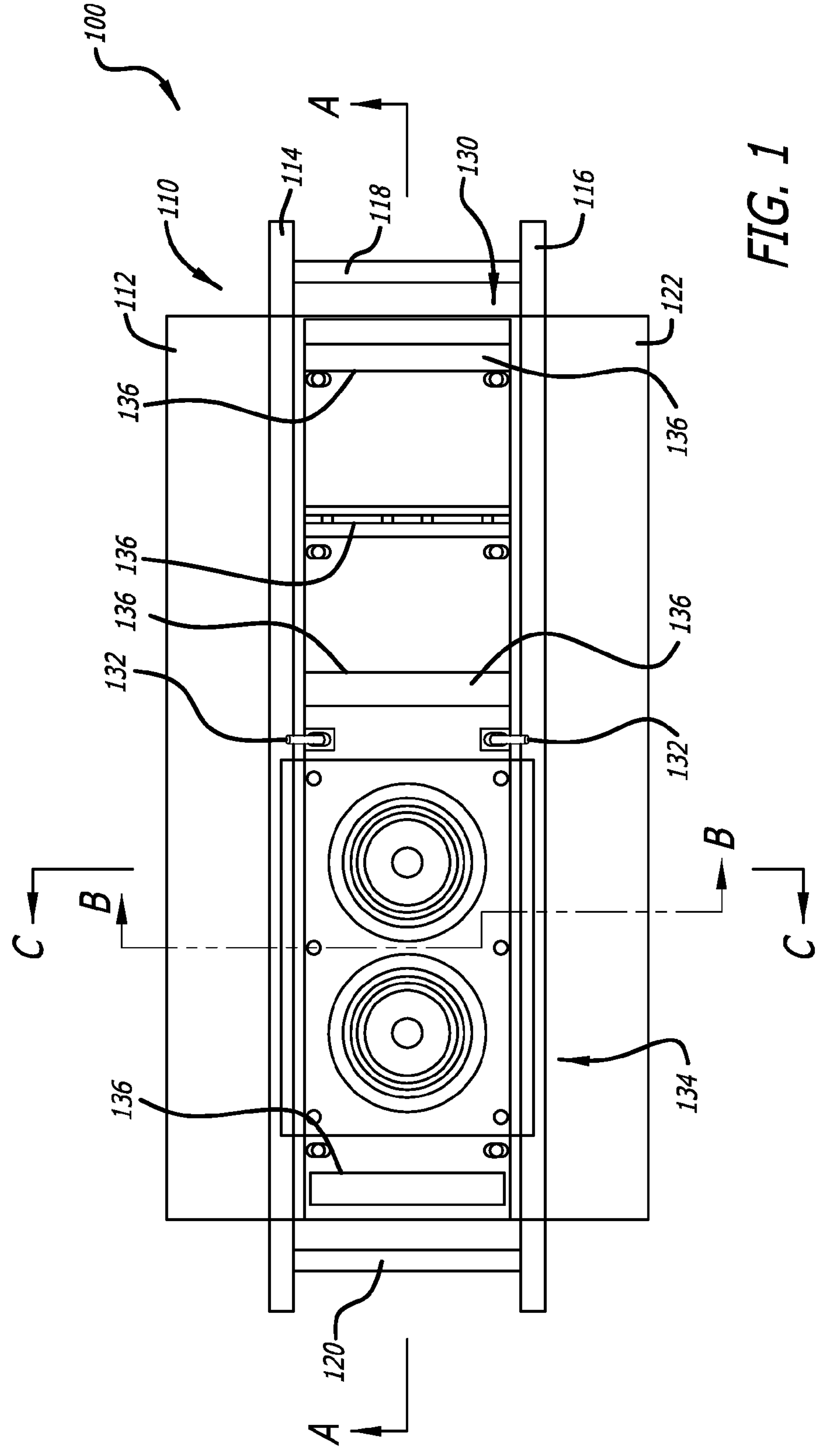
FIG. 1 is a front elevation view of a loudspeaker mounting assembly according to one example of an implementation.

FIG. 1 illustrates a front elevation view of a loudspeaker mounting assembly 100 according to one example. In the illustrated example, the loudspeaker mounting assembly 100 is configured for being mounted to a structure 110 that may include one or more structural elements such as a wall, ceiling, elongated support members, or the like. In particular, the structure 110 may have an outer surface 112 that faces a listening area (e.g., an indoor room, an outdoor area, or the like) such that sound energy produced and transferred by one or more loudspeakers of the loudspeaker mounting assembly 100 propagates into or toward the listening area generally away from the outer surface 112 of the structure 110. In addition, the loudspeaker mounting assembly 100 is configured for being mounted to the structure 110 such that most or all of the loudspeaker mounting assembly 100 is installed within the depth of the structure 110 and thus does not introduce any appreciable obstruction into the listening area or otherwise require space or a footprint within the listening area. Moreover, the loudspeaker mounting assembly 100 is configured for being mounted to the structure 110 such that the loudspeaker mounting assembly 100 is fully supported by the structure 110 while, at the same time, the components of the loudspeaker mounting assembly 100 that produce or transfer acoustical information are isolated from the structure 110. That is, most or all oscillations or vibrations resulting from the operation of the sound-producing components of the loudspeaker mounting assembly 100—including vibrations associated with mechanical translations and pressure changes—are damped or reduced such that sound quality is not compromised as a result of the installation.

The structure 110 to which loudspeaker mounting assembly 100 is mounted may be any structure 110 suitable for supporting or providing a mounting site for the loudspeaker mounting assembly 100. In the illustrated example, the structure 110 is a studded wall section. The studded wall section may be of conventional design. For instance, the studded wall section may include a system of support members such as vertical or side support members 114 and 116 and horizontal or transverse support members 118 and 120. In this example, the structure 110 (or at least that section of the structure 110 illustrated in FIG. 1) includes a pair of spaced-apart vertical support members 114 and 116 and a pair of spaced-apart horizontal support members 118 and 120 that cooperatively define an installation site. Typically, the vertical support members 114 and 116 and horizontal support members 118 and 120 are studs constructed from wood, although any suitable construction materials are applicable in the implementations described in this disclosure. As is also typical, the structure 110 may include a planar member such as a wall or ceiling 122, at least a portion of which is illustrated in FIG. 1. The wall portion 122 is disposed in front of the support member system for aesthetic and/or additional support purposes and may be fastened to the vertical support members 114 and 116 and/or horizontal support members 118 and 120 using nails, tacks, or the like. Any suitable type of wall 122 is applicable; examples include, but are not limited to, wallboard, drywall, sheetrock, gypsum sheet, and the like as those terms are understood by persons skilled in the art. Typically, the wall 122 is ⅝ inches in thickness. It will be understood that the terms "vertical" and "horizontal" are employed only in a relative sense, there being no limitation on the orientation of the loudspeaker mounting assembly 100 relative to the structure 110 or the listening area.

In the example illustrated in FIG. 1, the loudspeaker mounting assembly 100 may include an enclosure assembly 130, interface elements 132, and a loudspeaker assembly 134. In other implementations, the loudspeaker mounting assembly 100 may additionally include sound-damping elements 136. As will be described in more detail below, the interface elements 132 provide a means for both centering the loudspeaker mounting assembly 100 within the installation site (e.g., between the vertical support members 114 and 116) and isolating the loudspeaker mounting assembly 100 from the structural components defining the installation site. The interface elements 132 ensure that no part of the enclosure assembly 130 or loudspeaker assembly 134 contacts structural components such as the vertical support members 114 and 116. As a result, the loudspeaker mounting assembly 100 floats within the structure 110 to which it is installed. In the present example, the periphery of the enclosure assembly 130 is disposed proximal to the vertical support members 114 and 116. Accordingly, one or more interface elements 132 are provided at the sides of the enclosure assembly 130 nearest to the vertical support members 114 and 116. In other implementations, the periphery of the enclosure assembly 130 may also, or alternatively, be disposed proximal to the horizontal support members 118 and 120, in which case the interface elements 132 may also be provided at the sides of the enclosure assembly 130 nearest to the horizontal support members 118 and 120.

Figure 2:
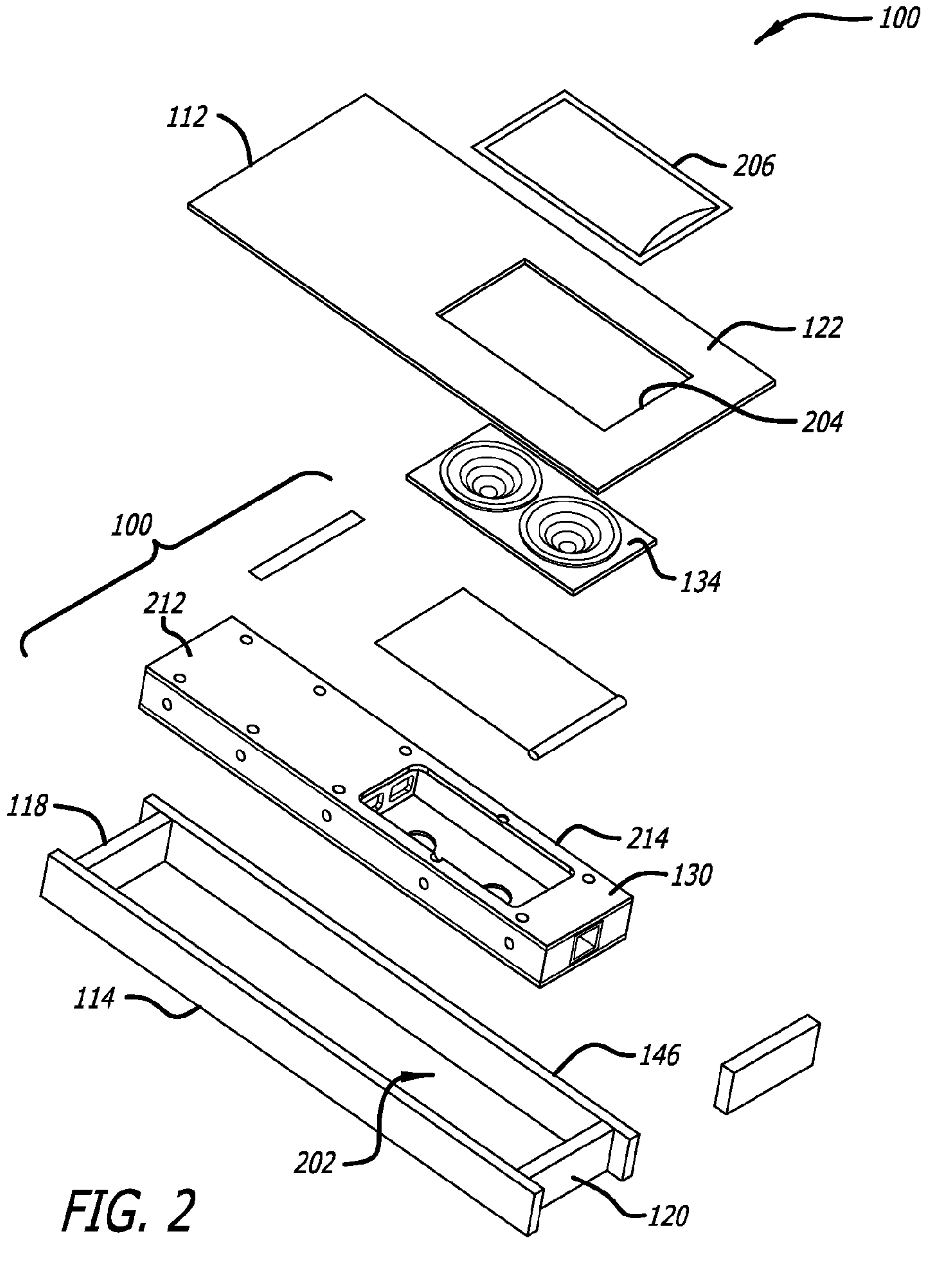
FIG. 2 is an exploded perspective view of the loudspeaker mounting assembly illustrated in FIG. 1.

FIG. 2 is an exploded perspective view of the loudspeaker mounting assembly 100 in which the components of the loudspeaker mounting assembly 100 are disassembled and illustrated apart from the structure 110 (FIG. 1). The vertical support members 114 and 116 and horizontal support members 118 and 120 of the structure 110 define an installation site 202 into which the loudspeaker mounting assembly 100 is installed. The wall 122 has a cut-out section or opening 204 through which sound energy can emanate from the loudspeaker assembly 134. On the side 112 of the wall 122 opposite to the enclosure assembly 130 and the loudspeaker assembly 134, i.e., the side of the wall 122 facing the listening area, a grille, mesh screen, or other perforated or slotted component 206 is mounted to the opening 204 of the wall 122 and serves as a protective means for the loudspeaker assembly 134 while permitting acoustical signals to propagate without adverse effect. Because the depth of the installation site 202 is typically limited (e.g., approximately 5-6 inches), in one implementation the enclosure assembly 130 is elongated. That is, the length of the enclosure assembly 130 is significantly greater than the width of the enclosure assembly 130. At least conceptually, the enclosure assembly 130 in this implementation can be considered as having an upper section 212 and a lower section 214. It will be understood that the terms "upper" and "lower" are employed only in a relative sense, there being no limitation on the orientation of the loudspeaker assembly 134 relative to a vertical or horizontal plane or point of reference. In the example illustrated in FIG. 2, the loudspeaker assembly 134 is sized for installation in the lower section 214 of the enclosure assembly 130. The interior of the lower section 214, however, fluidly communicates with the interior of the upper section 212 to permit the transmission of acoustic signals between the upper section 212 and the lower section 214. This elongated dimension of the enclosure assembly 130 makes up for any deficiencies in its depth. Given factors such as the size, power, and frequency range of the loudspeaker assembly 134 as appreciated by sound engineers, the enclosure assembly 130 can be dimensioned to provide an amount of enclosed volume appropriate for good sound production and transmission regardless of the size or shape of the loudspeaker assembly 134.

Figure 3:
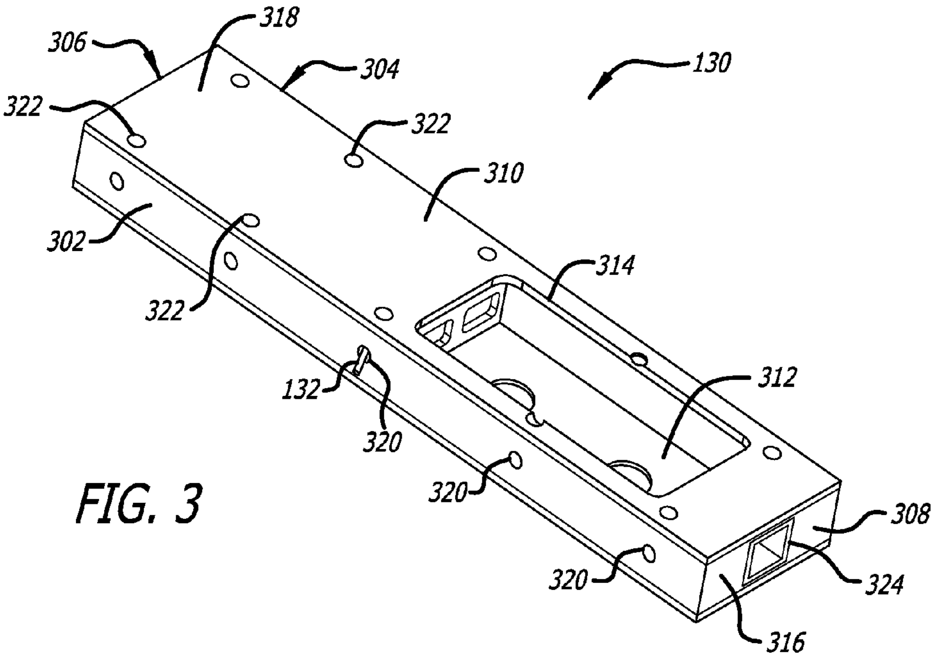
FIG. 3 is a perspective view of an enclosure assembly provided with the loudspeaker mounting assembly according to one example of an implementation.

FIG. 3 is a perspective view of the enclosure assembly 130. In the implementation illustrated in FIG. 3, the enclosure assembly 130 forms a box-like structure that accommodates the mounting and positioning of the loudspeaker assembly 134 in the structure 110 (FIG. 1) in a secure and isolated manner. The enclosure assembly 130 may include a first side support member 302, a second side support member 304 spaced from the first side member 302 by a distance, a top support member 306, a bottom support member 308 spaced from the top member 306 by a distance, a front or transverse support member 310, and a rear or transverse support member 312 spaced from the front member 310 by a distance. It will be understood that the terms "top", "bottom", and "front", "rear", and "side" are employed in a relative sense, and thus are not intended to connote any particular orientation of enclosure assembly 130 relative to any particular plane or point of reference. The first side member 302, second side member 304, top member 306, bottom member 308, front member 310, and rear member 312 cooperatively define an interior of the enclosure assembly 130 into which the loudspeaker assembly 134 extends while mounted to the enclosure assembly 130. At least a portion of the front member 310 and rear member 312 span the distance between the first side member 302 and second side member 304 and the distance between the top member 306 and bottom member 308 to form the enclosure assembly 130. The front member 310 has a cut-out section or opening 314 for receiving the loudspeaker assembly 134 into the interior of the enclosure assembly 130. The first side member 302, second side member 304, top member 306, bottom member 308, front member 310, and rear member 312 each have an outer surface that faces generally away from the interior of the enclosure assembly 130. For example, an outer surface 316 of the bottom member 308 and an outer surface 318 of the front member 310 can be seen in FIG. 3. The various members of the enclosure assembly 130 may be constructed from any material suitable for supporting the loudspeaker assembly 134. The material may include but is not limited to wood.

As shown in FIG. 3, the first side member 302 has one or more bores 320 formed (such as, for example, by, drilling) through its thickness. One or more of these bores 320 may be provided for receiving one or more corresponding interface elements 132. For convenience, only one interface element 132 is illustrated in FIG. 3. The number of bores 320 and corresponding interface elements 132 may be selected according to, for example, the length of the enclosure assembly 130. Although not visible in FIG. 3, it will be understood that the second side member 304 may likewise have one or more bores 320 for receiving one or more interface elements 132. In one implementation, as illustrated in FIG. 3, each bore 320 may be angled relative to a surface of its side member 302 or 306. The angled orientation may be useful when it is desired that the interface elements 132 contact a central region of the vertical support member 114 or 116 of the structure 110 in which the enclosure assembly 130 is to be mounted. As previously indicated, in other implementations, the top member 306 and bottom member 308 may additionally or alternatively include bores 320 for receiving interface elements 132. As further shown in FIG. 3, the front member 310 may have access holes 322 formed through its thickness. The number of access holes 322 may correspond to the number of side member bores 320. The access holes 322 provide openings through which the interface elements 132 may be inserted into the side member bores 320. Depending on the thickness of the first side member 302 and the second side member 304, the access holes 322 may register directly with the side member bores 320, or may be merely aligned with the side member bores 320 with a portion of the interior of the enclosure assembly 130 (or an additional component within the enclosure assembly 130) being present between each corresponding access hole 322 and side member bore 320.

In the exemplary implementation illustrated in FIG. 3, the bottom member 308 includes a wiring feature 324 for accommodating wiring that communicates with loudspeaker assembly 134. As will be appreciated by persons skilled in the art, the wiring feature 324 may include features adapted for routing wiring into and out from the interior of the enclosure assembly 130, and may function as a strain relief for such wiring. Although not visible in FIG. 3, it will be understood that the top member 306 may likewise include a wiring feature 324 (see, e.g., FIG. 11).

Figure 4:
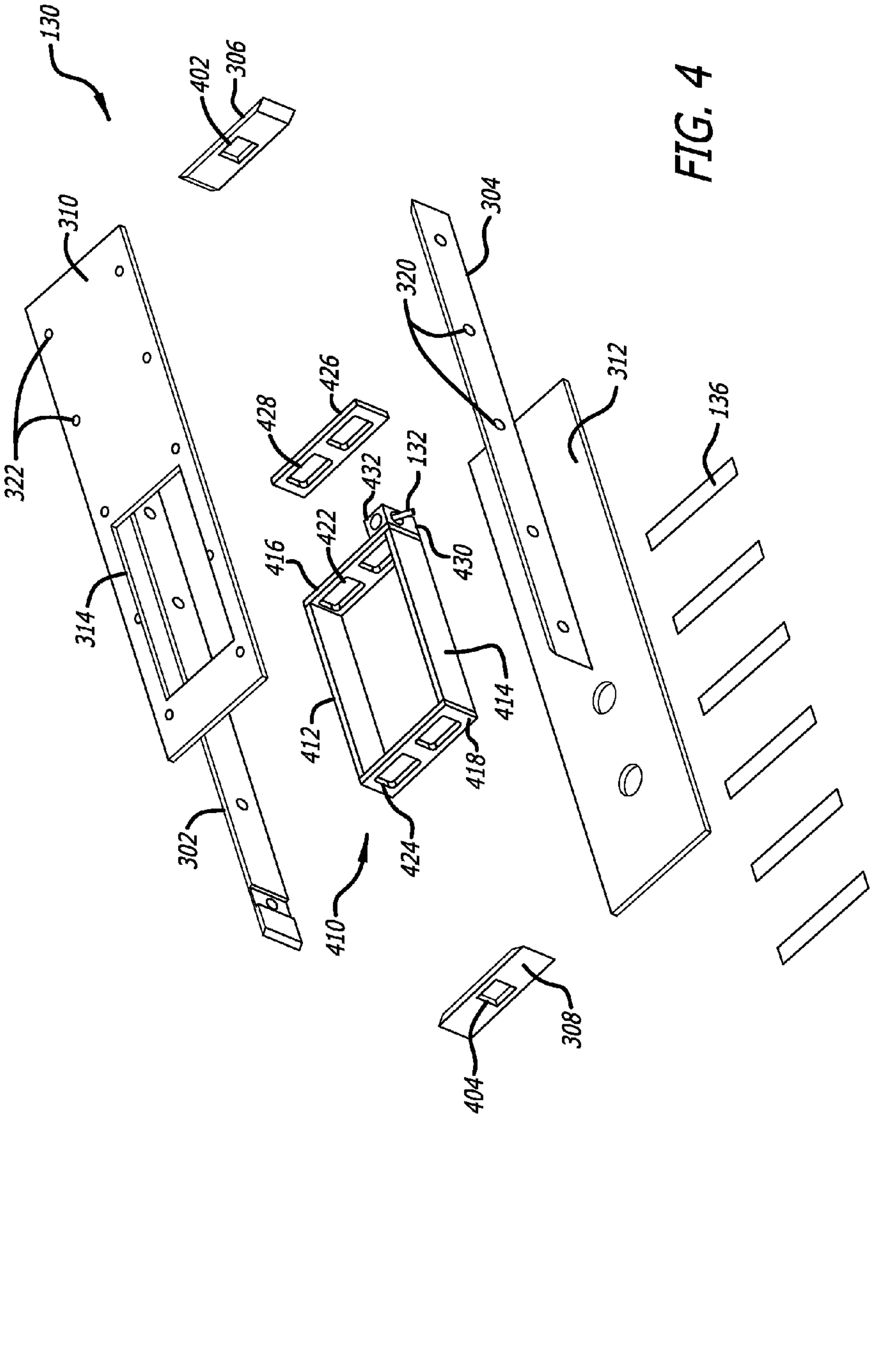
FIG. 4 is an exploded view of the enclosure assembly illustrated in FIG. 3.

FIG. 4 illustrates an exploded view of the enclosure assembly 130 in unassembled form. The top member 306 and bottom member 308 may each include respective cut-out sections or apertures 402 and 404 for receiving a wiring feature 324 such as illustrated in FIG. 3. The ends of the first side member 302, second side member 304, top member 306, and bottom member 308 may be beveled to form miter joints, but it will be appreciated that these components may be adjoined by any suitable technique. In the example illustrated in FIG. 4, a frame 410 is provided for additional support for the loudspeaker assembly 134. The frame 410 may include a first side piece 412, a second side piece 414 spaced from the first side piece 412 by a distance, a top piece 416, and a bottom piece 418 spaced from the top piece 416 by a distance. In assembled form, the first side piece 412 may abut the inside surface of the first side member 302 and, likewise, the second side piece 414 may abut the inside surface of the second side member 304. The top piece 416 and bottom piece 418 include respective cut-out sections or apertures 422 and 424 to permit the propagation of sound energy through the interior of the enclosure assembly 130. In addition to the top piece 416 and bottom piece 418, the enclosure assembly 130 may include one or more additional transverse pieces 426 spanning the distance between the first side member 302 and second side member

304 to impart additional structural rigidity to the enclosure assembly 130. These additional transverse pieces 426 may also include apertures 428 for sound transmission. As further shown in FIG. 4, mounting blocks 430 may be provided to further define bores 432 through which interface elements 132 are inserted. For convenience, only one mounting block 430 is illustrated in FIG. 4. The bores 432 of the mounting blocks 430 may be angled in alignment with the axes of the side member bores 320 and access holes 322. Thus, after assembly of the enclosure assembly 130, the interface elements 132 may be respectively inserted through the access holes 322, mounting block bores 432, and side member bores 320. As further shown in FIG. 4, a plurality of sound-damping elements 136 such as strips may be provided as previously described.

FIG. 5 is a plan view of the rear member 312 of the enclosure assembly 130. The sound-damping strips 136 may be secured, such as by adhesion, to an outer face 502 of the rear member 312. In this manner, the sound-damping strips 136 function as an additional isolation buffer between the enclosure assembly 130 and a portion of the structure 110 adjacent to the rear member 312. Although not specifically shown, additional sound-damping strips 136 may be provided for securement to the outer face of the front member 310 to provide an additional measure of isolation between the enclosure assembly 130 and a portion of the structure 110 adjacent to the front member 310 (e.g., the wall portion 122 shown in FIG. 1). The sound-damping strips 136 may be constructed from any material suitable for isolating oscillations related to sound-induced mechanical translations and vibrations resulting from pressure differentials. Examples include, but are not limited to, polymers such as rubbers. More specific examples include cellular materials such as foams. For example, urethane foam has been found suitable for the implementations described in this disclosure. Generally, the sound-damping strips 136 may be constructed from the same or similar material as the interface elements 132.

FIG. 6 illustrates a top view of the enclosure assembly 130. In this example, the access holes 322 are oriented at an angle in alignment with the angle of the side member bores 320 shown in FIG. 3 and, if provided, the mounting block bores 432 shown in FIG. 4. As further shown in FIG. 6, recesses 602 may be formed in the inside surface of the rear member 312 of the enclosure assembly 130. The recesses 602 are shaped (e.g., circular) to receive the drivers of the loudspeaker assembly 134.

Figure 7A:
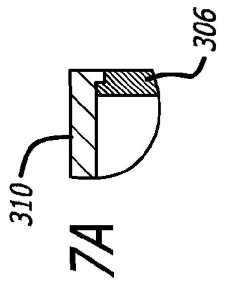
FIG. 7 is a lengthwise cross-sectional view of the enclosure assembly taken along line A-A' of FIG. 6.
Figure 7:
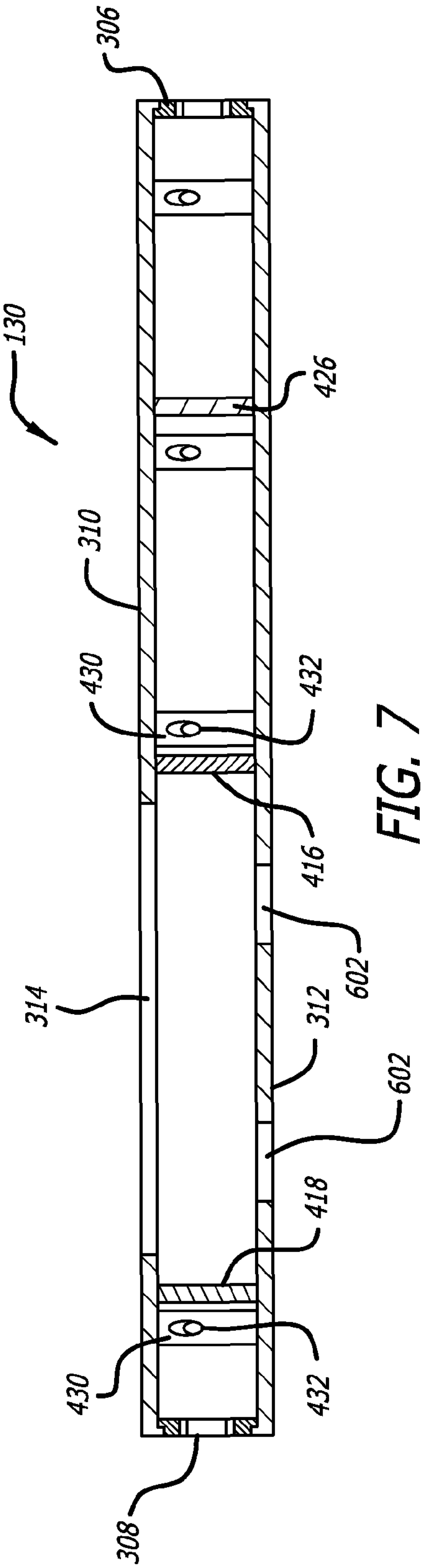

FIG. 7 illustrates a lengthwise cross-sectional view of the enclosure assembly 130 taken along line A-A' of FIG. 6. The respective positions of the mounting blocks 430 on one side of the enclosure assembly 130 in the interior of the enclosure assembly 130 are clearly shown, as well as the respective positions of the top piece 416, the bottom piece 418, and the additional transverse member 426. Also shown in a detailed view is the interface between the front member 310 and the top member 306 of the enclosure assembly 130. By way of example, the ends or edges of the front member 310 and top member 306 are adjoined in a lapped relation, although it will be understood that these components may be adjoined by any suitable technique. The ends or edges of the front member 310 and bottom member 308 may be adjoined in a similar mariner.

Figure 8A:
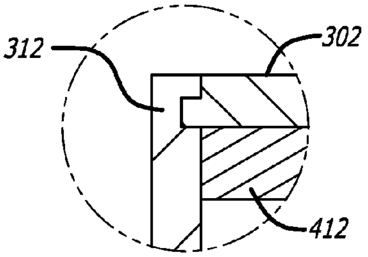
FIG. 8 is a widthwise cross-sectional view of the enclosure assembly taken along line B-B' of FIG. 6.
Figure 8:
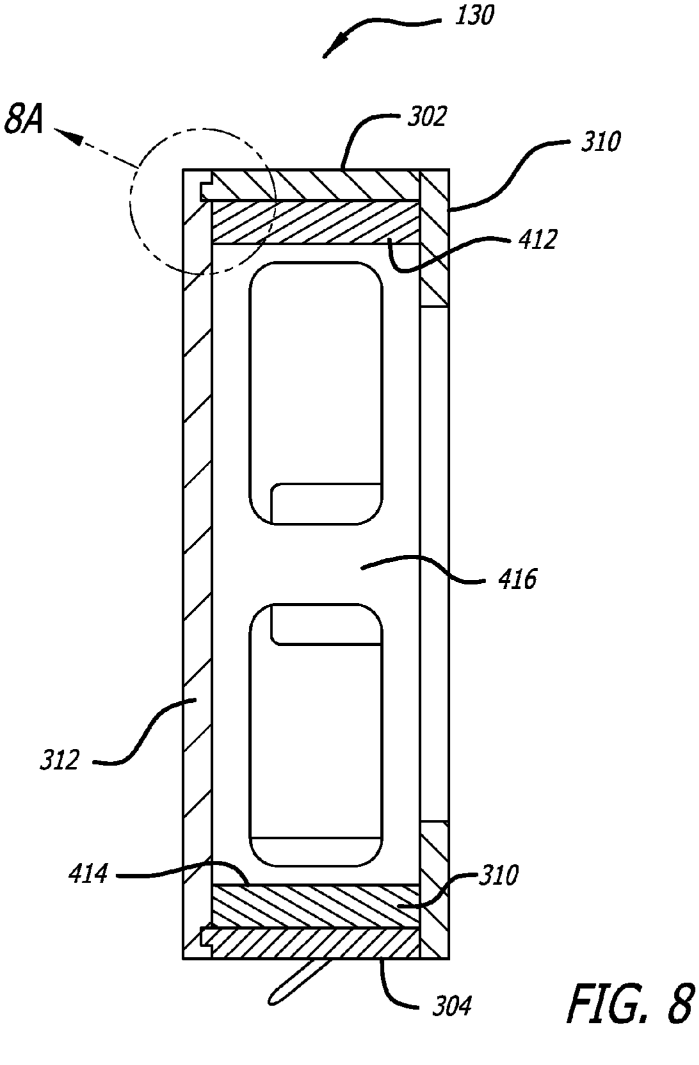

FIG. 8 illustrates a widthwise cross-sectional view of the enclosure assembly 130 taken along line B-B' of FIG. 6. In the illustrated example, the first side piece 412 of the frame 410 within the enclosure assembly 130 abuts the inside surface of the first side member 302. Also shown in a detailed view is the interface between the rear member 312 and first side member 302 of the enclosure assembly 130. By way of example, the ends or edges of the rear member 312 and first side member 302 are adjoined in a lapped relation, although it will be understood that these components may be adjoined by any suitable technique. The ends or edges of the front member 310 and first side member 302, as well as those of the front member 310 and/or rear member 312 and second side member 304, may be adjoined in a similar manner.

Figure 9:
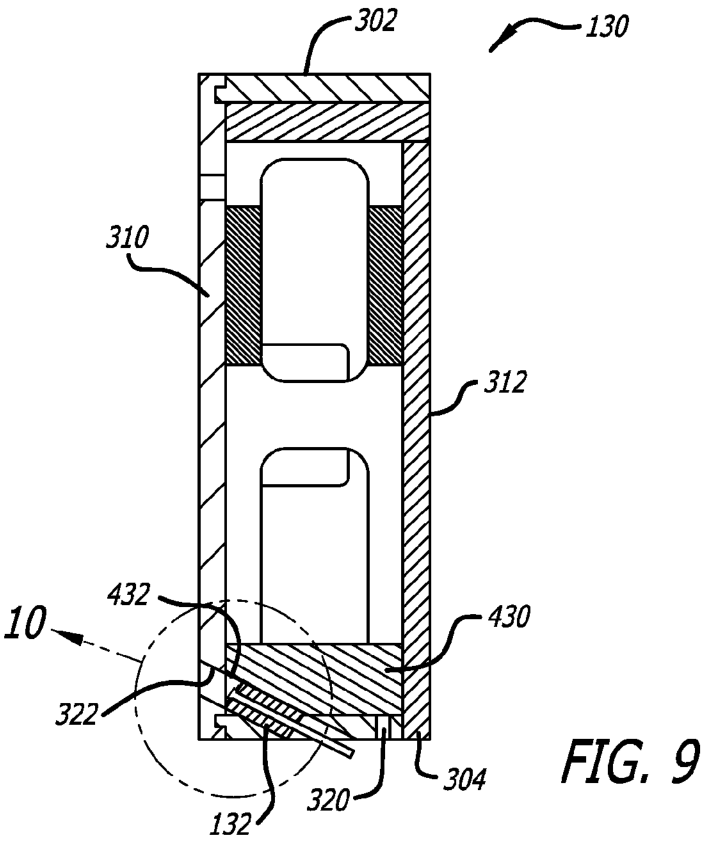
FIG. 9 is a widthwise cross-sectional view of the enclosure assembly taken along line C-C' of FIG. 6.

FIG. 9 illustrates a widthwise cross-sectional view of the enclosure assembly 130 taken along line C-C' of FIG. 6. In this example, one mounting block 430 is shown to be positioned in abutment with the second side member 304, front member 310, and rear member 312 of the enclosure assembly 130. The access hole 322 of the front member 310, the bore 432 of the mounting block 430, and the bore 320 of the second side member 304 are aligned with each other to provide a resultant through-bore through which the interface element 132 is inserted. In this exemplary implementation, the axis about which the through-bore exists is angled relative to the surfaces of the front member 310, mounting block 430, and second side member 304. As previously indicated, this angled configuration facilitates insertion of the interface element 132 from the access hole 322 of the front member 310 (e.g., after placement of the enclosure assembly 130 in the structure 110) while ensuring contact between the interface element 132 and a central region of the structure 110 (e.g., the side support member 114 or 116 as shown in FIG. 1).

Figure 10:
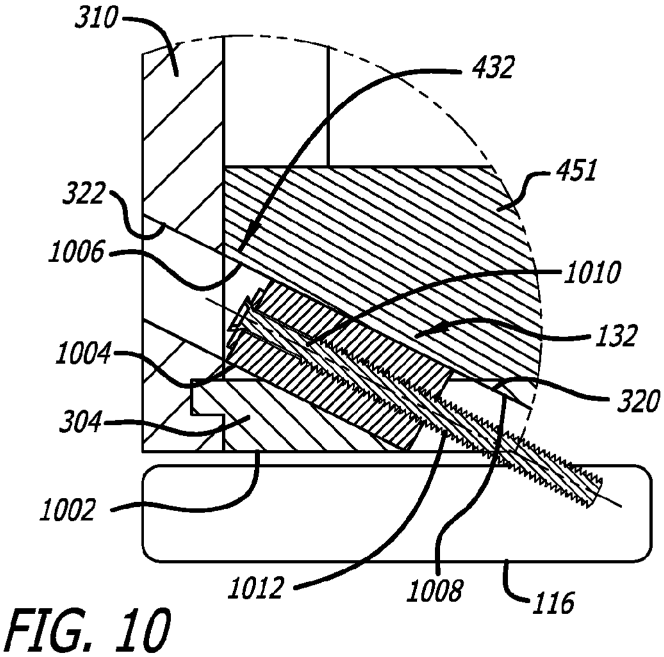
FIG. 10 is a cross-sectional view illustrating an interface element provided with the loudspeaker mounting assembly according to one example of an implementation.

FIG. 10 is a cross-sectional view illustrating the interface element 132 according to an exemplary implementation that enables the interface element 132 to provide an interface between the enclosure assembly 130 and the structure 110 (e.g., the side support member 116 shown in FIG. 1) for the purposes of isolation and mounting. In the illustrated example, the interface element 132 extends beyond an outer face 1002 of the second side member 304, generally away from the enclosure assembly 130, and into contact with the side support member 116 of the structure 110 to which the loudspeaker mounting assembly 100 is mounted. Referring also to FIG. 1, by providing one or more interface elements 132 on either side of the enclosure assembly 130, it can be seen that the interface elements 132 serve to center the loudspeaker mounting assembly 100 within the structure 110 (such as between the two side support members 114 and 116) while maintaining a structural gap between the loudspeaker mounting assembly 100 and the structure 110. Hence, no part of the loudspeaker mounting assembly 100 contacts the structure 110. Consequently, any oscillations produced in or propagated through the enclosure assembly 130 are prevented from being transferred to the structure 110, or at least are reduced to a degree sufficient to prevent undue vibrations in the structure 110 (particularly the wall portion 122 shown in FIG. 1) and degradation of sound quality.

In advantageous implementations, the interface element 132 is constructed from a sound-, vibration-, or oscillation-damping material to enhance the isolating function of the interface element 132. Examples include, but are not limited to, polymers, cellular materials, rubbers, and urethane. More specific examples include cellular materials such as foams. For example, urethane foam has been found suitable for the implementations described in this disclosure. The sound-dampening elements 136 (FIGS. 1 and 4) described earlier may be constructed from similar materials. In further advantageous implementations, the material of the interface element 132 is deflectable or resilient such that compression of the interface element 132 along the axial direction (i.e., in a direction along the axis of the through-bore defined by the access hole 322 of the front member 310, the bore 432 of the mounting block 430, and/or the bore 320 of the second side member 304 of the enclosure assembly 130) causes outward expansion or swelling of the interface element 132 along the radial direction normal to the axial direction. In this manner, the interface element 132 may be compressed so as to expand outwardly and fill the cross-section of the through-bore, thus increasing the area of contact of an outer peripheral surface 1004 of the interface element 132 with the enclosure assembly 130 and optimizing the isolating function. For instance, in FIG. 10, the bore 432 of the mounting block 430 is defined by an inner surface 1006 of the mounting block 430, and the bore 320 of the side member 304 is defined by an inner surface 1008 of the side member 304. The interface element 132 may be axially deflected such that all or part of its body is deflected radially outwardly. As a result, contact between the outer surface 1004 of the interface element 132 and the inner surface 1006 of the mounting block 430 and/or the inner surface 1008 of the side member 304 is improved.

As an alternative to causing outward deflection of the interface element 132, the interface element 132 may have an outside diameter that is greater than the respective diameters of the bores 320 and 432. In this case, the interface element 132 may be installed by press-fitting the interface element 132 into the bores 320 and 432.

In some implementations as illustrated in FIG. 10, the interface element 132 has an axial bore 1010 and an elongated element 1012 is inserted through the axial bore 1010 to cause axial compression or deflection of the interface element 132. The elongated element 1012 may be a fastener and particularly a threaded fastener such as a screw. The screw may be tapped into the side support member 116 of the structure 110 by a distance sufficient to cause a desired degree of axial compression, and hence radial expansion, of the interface element 132 through its contact with the head of the screw. The screw may be turned by a screwdriver or other appropriate tool inserted into the through-bore via the access hole 322 of the front member 310 of the enclosure assembly 130. As a fastener, the elongate element 1012 may function as a mounting component. It can be seen from FIG. 10, however, that the elongate element 1012 is fully surrounded by the interface element 132 and thus does not alter the floating, isolated state of the loudspeaker mounting assembly 100 within the structure 110.

Figure 11:
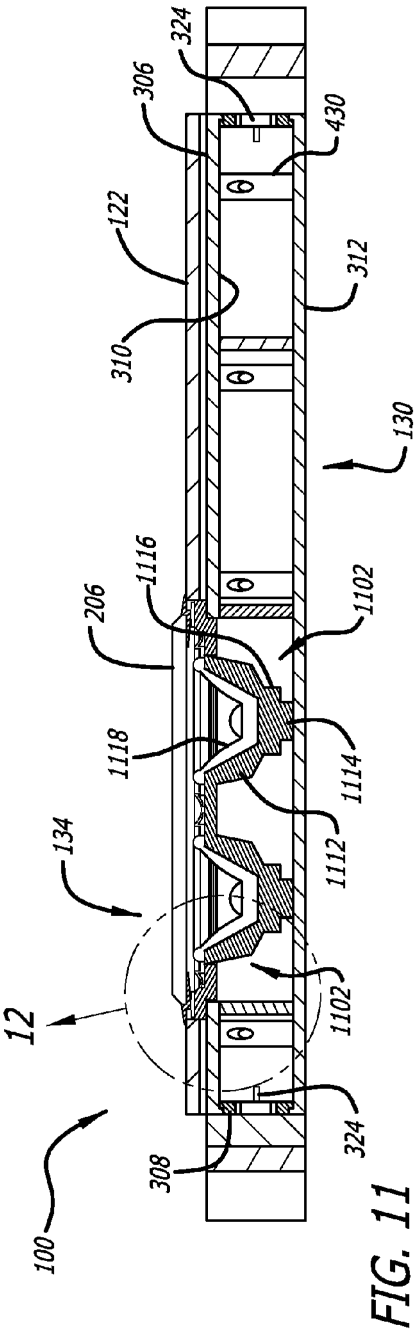
FIG. 11 is a lengthwise cross-sectional view of the loudspeaker mounting assembly taken along line A-A' of FIG. 1.

FIG. 11 is a lengthwise cross-sectional view of the loudspeaker mounting assembly 100 in assembled form taken along line A-A' of FIG. 1, with the loudspeaker assembly 134 installed in the enclosure assembly 130. The loudspeaker assembly 134 may include one or more loudspeaker units 1102. The loudspeaker units 1102 may be configured to process any desired range of the audio frequency band, such as a high range (generally 2 kHz-20 kHz) typically produced by tweeters, a midrange (generally 200 Hz-5 kHz) typically produced by midrange drivers, and a low range (generally 20 Hz-1 KHz) typically produced by woofers. Moreover, the loudspeaker units 1102 may be of any type. Generally, each loudspeaker unit 1102 includes a housing 1112 enclosing one or more of its components and an electroacoustic transducer or driver 1114. Electrical signals encoding auditory information are fed to the driver 1114 and the driver 1114 converts the electrical signals to acoustic signals. The acoustic signals propagate through the interior of the enclosure assembly 130, through the grille 206, and into the listening area. In some implementations, one or more of the loudspeaker units 1102 include a voice coil 1116 and a movably suspended diaphragm 1118. In other implementations, one or more of the loudspeaker units 1102 include a horn and/or waveguide for directing sound waves.

Figure 12:
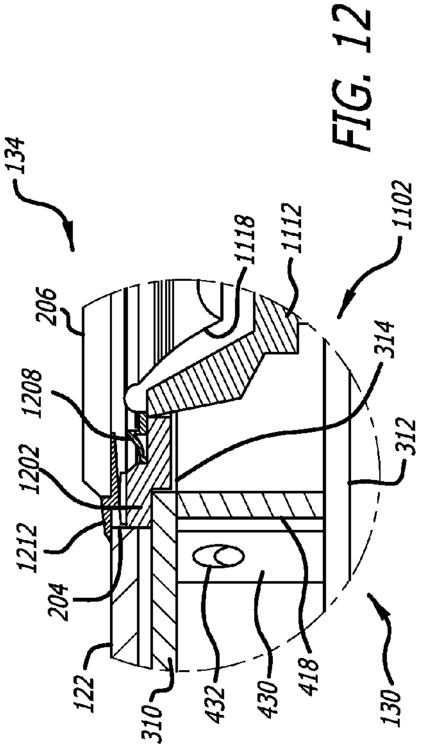
FIG. 12 is a cut-away cross-section view taken from a section of the view of FIG. 11.

FIG. 12 is a cut-away cross-sectional view taken from a section of the view of FIG. 11, and illustrates the interface between the loudspeaker assembly 134, enclosure assembly 130, and wall portion 122. The loudspeaker assembly 134 includes a baffle 1202 supporting the loudspeaker units 1102. The housing 1112 of each loudspeaker unit 1102 extends through an opening of the baffle 1202 into the interior of the enclosure assembly 130. The baffle 1202 is disposed in the opening 204 of the wall portion 122. A portion of the baffle 1202 is disposed on the outer face of the front member 310 of the enclosure assembly 130, while another portion extends into the opening 314 of the front member 310. In the illustrated example, a suspension member 1208 of the loudspeaker unit 1102 that supports the diaphragm 1118 is disposed on the baffle 1202. The grille 206 includes a peripheral flange or rim 1212 that is disposed on the outer surface of the wall portion 122. It is appreciated by persons skilled in the art that, for purposes of mounting or making physical connections, one or more of the components comprising the loudspeaker assembly 134 may be fastened to each other, to the enclosure assembly 130, or to the wall portion 122 by means of suitable fasteners (e.g., screws, bolts, rivets, or the like) as needed or desired. However, the grille 206 may be kept physically separate from the loudspeaker assembly 134 so as to isolate the grille 206 and the wall portion 122 from oscillatory sources associated with the loudspeaker assembly 134.

Figure 13:
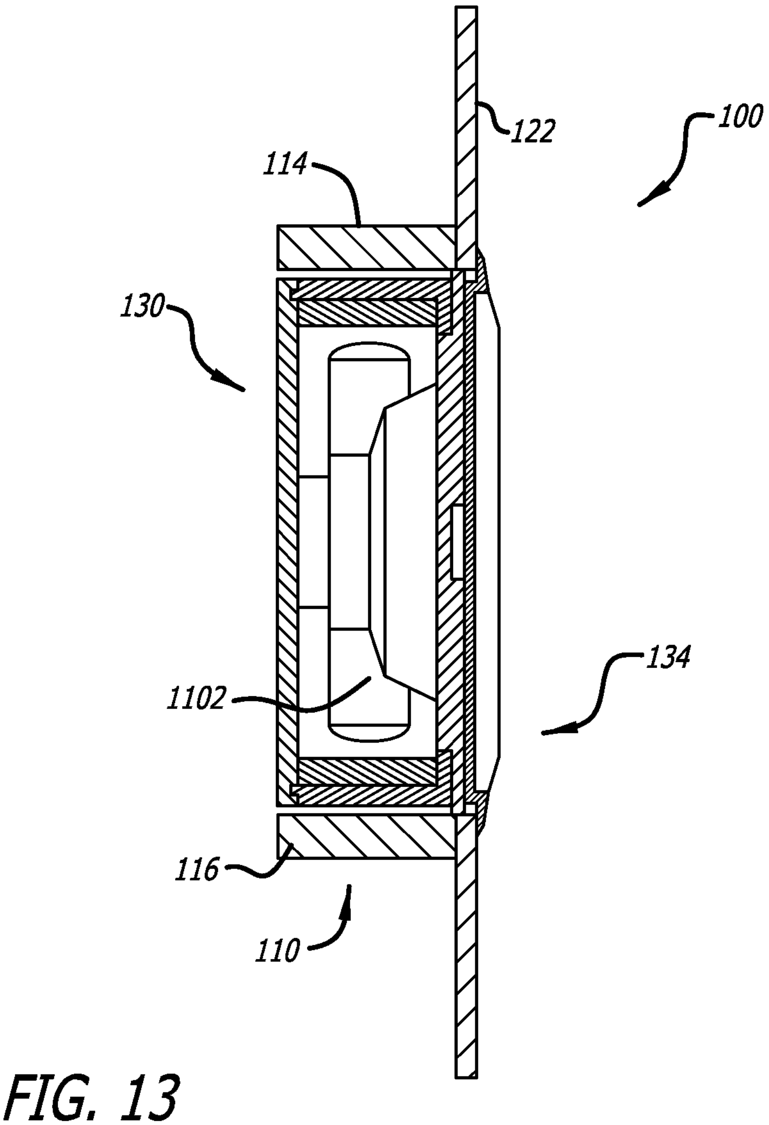
FIG. 13 is a widthwise cross-sectional view of the loudspeaker mounting assembly taken along line B-B' of FIG. 1.

FIG. 13 is a widthwise cross-sectional view of the loudspeaker mounting assembly 100 taken along line B-B' of FIG. 1. The loudspeaker assembly 134 is fully assembled and disposed in the enclosure assembly 130. The resulting loudspeaker mounting assembly 100 is mounted in the installation site 202 (FIG. 2) of the structure 110 (FIG. 1) in the floating, isolating condition previously described. For example, the loudspeaker mounting assembly 100 may be interposed between the side support members 114 and 116 of the structure 110 and behind the wall portion 122. The deployment of the interface elements 132 as previously described ensures that physical gaps are maintained between the loudspeaker mounting assembly 100 and the side support members 114 and 116. Moreover, the loudspeaker mounting assembly 100 does not contact the wall portion 122 or any back surface (not shown) of the structure 110 due to physical gaps and/or the use of the sound-damping strips 136 as previously described. As a result, the loudspeaker mounting assembly 100 is mounted to the structure 110 in non-contacting, isolated relation with the structure 110.

The foregoing description of an implementation has been presented for purposes of illustration and description. It is not exhaustive and does not limit the claimed inventions to the precise form disclosed. Modifications and variations are possible in light of the above description or may be acquired from practicing the invention. The claims and their equivalents define the scope of the invention.

What is claimed is:

1. A loudspeaker mounting assembly for mounting a loudspeaker in an isolated relation to a structure, the loudspeaker mounting assembly comprising:

an enclosure having an interior for receiving the loudspeaker and including at least two spaced-apart support members, each of the at least two support members including a support member outer surface and an inner surface extending from the support member outer surface into the support member, the inner surface defining a support member bore, where each support member bore of the at least two support members is oriented at an acute angle relative to the corresponding support member outer surface; and a plurality of interface elements composed of a vibration-damping material and including respective interface element outer surfaces, each interface element disposed in a corresponding one of the support member bores and at least partially extending out from the respective support member outer surface, where each interface element outer surface contacts the respective inner surface of the support member.

2. The mounting assembly of claim 1 where the enclosure includes a transverse member extending between the at least two support members.

3. The mounting assembly of claim 2 where the transverse member has an opening into the interior for receiving the loudspeaker.

4. The mounting assembly of claim 2 where the transverse member includes a transverse member outer surface generally facing away from the interior and has a plurality of access holes, each access hole being aligned with a corresponding support member bore for providing access to the support member bore from the transverse member outer surface such that an elongated member may be received by each access hole and extend through the transverse member and through the corresponding support member bore to engage the structure adjacent to the support member for securing the enclosure to the structure.

5. The mounting assembly of claim 2 where the transverse member includes a transverse member outer surface generally facing away from the interior, and the mounting assembly further includes a vibration-damping element disposed on the transverse member outer surface for impeding the transfer of vibrations from the enclosure to the structure.

6. The mounting assembly of claim 5 where the vibration-damping element includes a cellular material.

7. The mounting assembly of claim 5 where the vibration-damping element includes a polymeric material.

8. The mounting assembly of claim 5 where the vibration-damping element includes a rubber material.

9. The mounting assembly of claim 5 where the vibration-damping element includes a urethane material.

10. The mounting assembly of claim 1 where the enclosure includes first and second spaced-apart transverse members extending between the at least two support members.

11. The mounting assembly of claim 10 where the first and second transverse members include respective opposing first and second outer surfaces generally facing away from the interior, and the mounting assembly further includes a first vibration-damping element disposed on the first outer surface and a second vibration-damping element disposed on the second outer surface for impeding the transfer of vibrations from the enclosure to the structure.

12. The mounting assembly of claim 1 where each support member bore extends along a bore axis, and the material of each interface element is deflectable along the bore axis such that the outside diameter of the material increases and the interface element outer surface deflects outwardly into contact with the inner surface of the support member defining the support member bore.

13. The mounting assembly of claim 1 where the material of each interface element is press-fitted into the support member bore.

14. The mounting assembly of claim 1 where the material of each interface element includes a cellular material.

15. The mounting assembly of claim 1 where the material of each interface element includes a polymeric material.

16. The mounting assembly of claim 1 where the material of each interface element includes a rubber material.

17. The mounting assembly of claim 1 where the material of each interface element includes a urethane material.

18. The mounting assembly of claim 1 where the interface elements have respective interface element bores, and the mounting assembly further includes a plurality of elongated members disposed in the respective interface element bores for deflecting the respective interface elements.

19. The mounting assembly of claim 18 where each elongate member includes a fastening element.

20. The mounting assembly of claim 19 where each fastening element is threaded.

21. The mounting assembly of claim 1 where one of the at least two support members has an opening into the interior for receiving the loudspeaker.

22. A loudspeaker assembly mountable in an isolated relation to a structure, the loudspeaker assembly comprising:

an enclosure having an interior and an opening communicating with the interior, the enclosure including:

at least two spaced-apart support members, each of the at least two support members including a support member outer surface and an inner surface extending from the support member outer surface into the support member, the inner surface defining a support member bore; and a transverse member extending over the at least two support members, where the transverse member includes a transverse member outer surface generally facing away from the interior and has a plurality of access holes, each access hole being aligned with a corresponding support member bore for providing access to the support member bore from the transverse member outer surface;

wherein each support member bore of the at least two support members is oriented at an acute angle relative to the corresponding support member outer surface such that an elongated member may be received by each access hole and extend through the transverse member and through the corresponding support member bore to engage the structure adjacent to the support member for securing the enclosure to the structure; and a loudspeaker mounted to the enclosure and extending into the interior through the opening; and a plurality of interface elements composed of a vibration-damping material and including respective interface element outer surfaces, each interface element disposed in a corresponding one of the support member bores and at least partially extending out from the respective support member outer surface, where each interface element outer surface contacts the respective inner surface of the support member.

23. The mounting assembly of claim 22 where the mounting assembly further includes a vibration-damping element disposed on the transverse member outer surface for impeding the transfer of vibrations from the enclosure to the structure.

24. The mounting assembly of claim 22 where each support member bore extends along a bore axis, and the material of each interface element is deflectable along the bore axis such that the outside diameter of the material increases and the interface element outer surface deflects outwardly into contact with the inner surface of the support member defining the support member bore.

25. The mounting assembly of claim 22 where the material of each interface element is press-fitted into the support member bore.

26. The mounting assembly of claim 1 where the interface elements have respective interface element bores, and the mounting assembly further includes a plurality of elongated members disposed in the respective interface element bores for deflecting the respective interface elements.

27. A method for installing a loudspeaker mounting assembly to a structure in an isolated manner, comprising:

providing a loudspeaker mounting assembly having an interior for receiving a loudspeaker and including at least two opposing outer surfaces generally facing away from the interior, each outer surface having an outer surface bore;

inserting a plurality of interface elements through respective access holes of a transverse member of the loudspeaker mounting assembly disposed between the at least two outer surfaces;

placing the plurality of interface elements composed of a vibration-damping material into respective outer surface bores such that the interface elements protrude beyond the respective outer surfaces; and mounting the enclosure at an installation site of the structure, the installation site bounded by two or more structural members of the structure, where the interface elements contact respective structural members such that the loudspeaker mounting assembly is isolated from the structure and the transfer of vibrations from the loudspeaker mounting assembly to the structure is impeded.

28. The method of claim 27 further comprising mounting a loudspeaker in the interior of the loudspeaker mounting assembly.

29. The method of claim 27 where the step of mounting the enclosure occurs before the step of placing the plurality of interface elements.

30. The method of claim 27 where the step of placing the plurality of interface elements occurs before the step of mounting the enclosure.

31. The method of claim 27 further comprising deflecting each interface element along an axis of a corresponding outer surface bore such that the interface element deflects outwardly into contact with the outer surface bore.

32. The method of claim 31 where deflecting each interface element along the axis comprises inserting an elongated member through a bore of the interface element.

33. The method of claim 27 where placing comprises press-fitting the interface element into the outer surface bore.

* * * * *